(12) United States Patent
Makino (10) Patent No.: US 6,873,062 B1
(45) Date of Patent: Mar. 29, 2005

(54) SWITCH CIRCUIT (75) Inventor: Jun Makino, Singapore (SG)

(73) Assignee: Creative Technology Ltd., Singapore (SG)

( * ) Notice: Subject to any disclaimer, the term of this patent is extended or adjusted under 35 U.S.C. 154(b) by 0 days.

(21) Appl. No.: 10/049,388

(22) PCT Filed: Aug. 13, 1999

(86) PCT No.: PCT/SG99/00084

§ 371 (c)(1),
(2), (4) Date: May 28, 2002

(87) PCT Pub. No.: WO01/13492

PCT Pub. Date: Feb. 22, 2001

(51) Int. Cl.$^7$ .............................................. H01H 35/00
(52) U.S. Cl. ......................... 307/126; 307/119; 307/125
(58) Field of Search ................................ 307/119, 125, 307/140

(56) References Cited

U.S. PATENT DOCUMENTS

| | | | | |
|---|---|---|---|---|
| 3,609,413 | A | * 9/1971 | Lane et al. | ................. 327/480 |
| 4,024,520 | A | * 5/1977 | Minks | ........................ 323/329 |
| 4,344,194 | A | * 8/1982 | Pearson | ......................... 4/213 |
| 4,398,098 | A | * 8/1983 | Minchey | ..................... 307/140 |
| 4,538,074 | A | 8/1985 | Fraden | ........................ 307/126 |
| 4,689,492 | A | 8/1987 | Peteuil | ....................... 307/142 |
| 5,598,093 | A | * 1/1997 | Acatrinei | .................... 323/299 |
| 5,886,426 | A | 3/1999 | Kim | ............................. 307/142 |
| 5,939,844 | A | * 8/1999 | Shiomi et al. | .............. 315/408 |
| 6,410,997 | B1 | * 6/2002 | Sjursen et al. | .............. 307/130 |

FOREIGN PATENT DOCUMENTS

| | | |
|---|---|---|
| EP | 0011969 | 6/1980 |
| EP | 0730349 | 9/1996 |
| EP | 0766362 | 4/1997 |
| JP | 9-168236 | 6/1997 |
| WO | 96/36099 | 11/1996 |

* cited by examiner

Primary Examiner—Brian Sircus
Assistant Examiner—Brett Squires
(74) Attorney, Agent, or Firm—Ostrolenk, Faber, Gerb & Soffen, LLP

(57) ABSTRACT

A switch circuit (10) controls the supply of electrical power from an electrical power source (11) to a load (R5). The switch circuit (10) includes a first transistor (Q1), the emitter of the first transistor (Q1) is adapted to be coupled to the power supply (11) and the collector is adapted to be coupled to the load (R5). An electronic switching device (Q2, Q3) includes an input, an output adapted to be coupled to the other side of the load (R5) and the power source (11), and an activating input. A first resistance device (R1) is coupled between the base of the first transistor (Q1) and the input of the electronic switching device (Q2. Q3). A momentary switch (S1) has first and second terminals (13, 14) and the activating input of the electronic switching device (Q2, Q3) is coupled to the first terminal (14) of the momentary switch. A pulse generation device (C1, R4) is coupled between the collector of the first transistor (Q1) and the second terminal (13) of the momentary switch (S1). A charge storing device (C2) is coupled between the collector of the first transistor (Q1) and the output of the electronic switching device (Q2, Q3).

14 Claims, 7 Drawing Sheets

"OFF STATE" NO CIRCUIT PATH

FIG. 1 "OFF STATE" NO CIRCUIT PATH

FIG. 2 PATH A, B & C

FIG. 3 PATH D

AUTOMATIC POWER DOWN WITH ELECTRICAL CONNECTION AT POINT (5)

AUTOMATIC POWER DOWN WITH ELECTRICAL CONNECTION AT POINT (4)

FIG 6

REMOTE CONTROL FROM ANOTHER SYSTEM, EXAMPLE ***

SWITCH CIRCUIT

The invention relates to a switch circuit and in particular, a switch circuit including a momentary switch.

Momentary switches for turning on and off electrical and electronic equipment operate using a logic type operation so that when a switch pulse is supplied to a switch circuit, the circuit switches from "off" to "on" or from "on" to "off".

The switch pulse is provided by actuation of the momentary switch which when actuated completes the circuit to provide a pulse to the switch circuit to switch the state of the switch circuit.

It is common practice for a number of different types of electrical and electronic equipment to use only a single momentary switch to switch the equipment both on and off.

However, one of the disadvantages of using a single momentary switch is that, during the off state, it is still necessary for power to be supplied to the switch circuit. This is because it is necessary to maintain a live switch circuit for sensing a switch pulse generated by the momentary switch at any time. Therefore, this power consumption constantly drains the battery or AC power even though the electronic equipment appears to be in an "off" state to a user.

This consumption of electrical power is especially important to battery operated equipment such as laptop computers and mobile (or hand) phones where the constant power requirement drains the battery even when the equipment is switched of f.

For example, in a typical laptop computer, the power consumption when the computer is switched off can be as high as 8 mA, which would mean that a 3300 mAh battery would be completely drained after seventeen days even with the laptop computer switched off. Where the computer has a smaller battery, the duration will be even less. For example, if the battery is only a 1800 mAh battery, the battery will be drained in only nine days even with the computer switched off all the time.

A similar problem exists with other equipment using momentary switches such as mobile phones, where the power consumption while the phone is switched off still leads to draining of the battery.

In accordance with the present invention, there is provided a switch circuit for controlling the supply of electrical power from an electrical power source to a load, the switch circuit comprising a first transistor, the emitter of the first transistor adapted to be coupled to the power supply and the collector adapted to be coupled to the load; an electronic switching device comprising an input, an output adapted to be coupled to the other side of the load and the power source, and an activating input; a first resistance device coupled between the base of the first transistor and the input of the electronic switching device; a momentary switch having first and second terminals, the activating input of the electronic switching device coupled to the first terminal of a momentary switch; a pulse generation device coupled between the collector of the first transistor and the second terminal of the momentary switch; and a charge storing device coupled between the collector of the first transistor and the output of the electronic switching device.

Preferably, the first transistor is a bipolar transistor, and more preferably a pnp bipolar transistor.

However, alternatively, the first transistor may be a MOSFET, such as an enhancement type MOSFET, and is typically a P channel enhancement type MOSFET.

Typically, the electronic switching device comprises a thyristor device, such as a transistor device and preferably comprises second and third transistors. The second and third transistors are typically bipolar transistors, one transistor being an npn transistor and the other being a pnp transistor. Preferably, where the first transistor is a pnp bipolar transistor, the second and third transistors are npn and pnp bipolar transistors, respectively.

However, where the first transistor is a P channel enhancement type MOSFET, the second and third transistors are N and P channel enhancement type MOSFETs, respectively.

Preferably, the base of the second transistor is coupled to the collector of the third transistor, and the base of the third transistor is coupled to collector of the second transistor.

Typically, the input to the electronic switching device is coupled to the emitter of the third transistor, the output is coupled to the emitter of the second transistor, and the activating input is coupled to the base of the third transistor and the collector of the second transistor.

Typically, the switch circuit may also comprise a first signal input contact coupled to the activating input of the electronic switching device which permits the switch circuit to be switched on using an electrical signal. Typically, the switch circuit may be switched on by applying a voltage with a sufficiently low magnitude to the signal input contact to forward bias the base of the third transistor.

Alternatively, the first signal input contact may be used to switch the switch circuit off by applying a voltage of a sufficiently high magnitude to reverse bias the base of the third transistor.

Typically, the switch circuit may further comprise a second signal input contact coupled to the collector of the third transistor and the base of the second transistor, to permit the electronic switching device to be switched off, and therefore, the first transistor to be switched off, by applying an electrical signal to the second signal input contact. Typically, the electrical signal applied to the second signal input contact is a ground signal.

The advantage of the first and second signal input contacts are that they permit the switch circuit to be switched off by the electronic equipment being supplied by the power supply without requiring activation of the momentary switch.

Alternatively, the first and second signal input contacts permit the switch circuit to be switched on and off by a remote system, without requiring activation of the momentary switch.

Preferably, the pulse generation device comprises a capacitance device and typically, a third resistance device in parallel with the capacitance device.

Typically, the switch circuit further comprises a fourth resistance device coupled between the emitter and base of the first transistor and a fifth resistance device coupled between the base of the second transistor and the output of the electronic switching device.

Examples of a switch circuit in accordance with the invention will be now be described with reference to the accompanying drawings, in which:—

Figure 1:
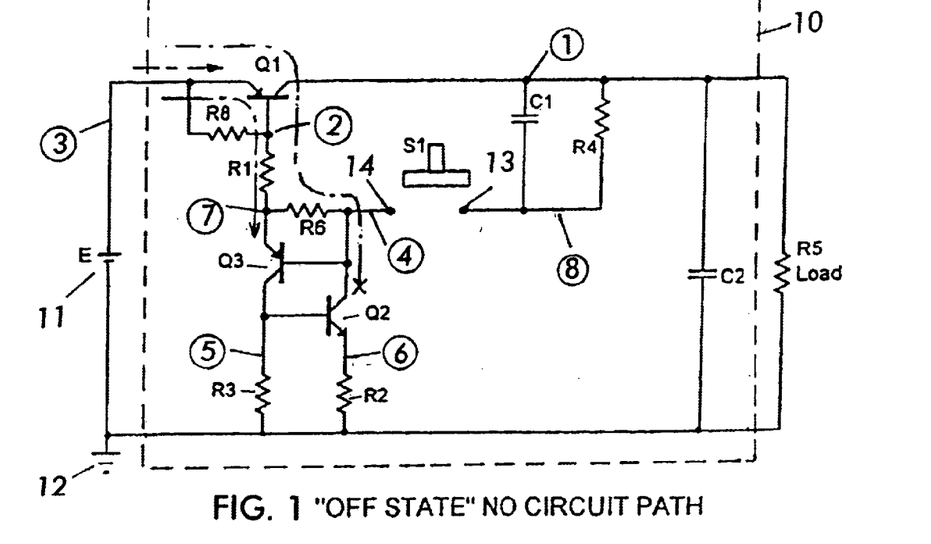
FIG. 1 is a circuit diagram of a first example of a switch circuit with a momentary switch in an open position.

FIG. 1 is a circuit diagram showing a switch circuit 10 which acts as an interface between a power supply in the form of a battery 11 and a load represented by resistor R5. The switch circuit 10 includes a pnp bipolar transistor Q1 with the emitter of the transistor Q1 coupled to the positive terminal of the battery 11. The collector terminal of the transistor Q1 is connected to one side of the load R5. A resistor R5 is coupled between the emitter terminal and the base terminal of the transistor Q1. The base of the transistor Q1 is also coupled to the emitter of a second transistor Q3 via a resistor R1. The transistor Q3 is also a pnp bipolar transistor. The emitter terminal of the second transistor Q3 is also coupled via a resistor R6 to a contact 14 of a momentary switch S1. Another contact 13 of the momentary switch S1 is coupled to the collector terminal of the transistor Q1 via a capacitor C1 and resistor R4 in parallel.

The contact 14 of the momentary switch S1 is also coupled to the base terminal of the second transistor Q3 and to the collector terminal of a third transistor Q2. The third transistor Q2 is an npn bipolar transistor. The base of the third transistor Q2 is coupled to the collector of the second transistor Q3 and the emitter of the third transistor Q2 is coupled to a ground potential 12 via a resistor R2. The collector of the second transistor Q3 is also coupled the ground potential 12 via resistor R3.

In parallel with the components described above is a capacitor C2 which is coupled between the collector of the first transistor Q1 and the ground potential 12. The capacitor C2 is also in parallel with the load R5.

The positive terminal of the battery 11 is coupled to the emitter terminal of the first transistor Q1 and the resistor R8 and the negative terminal of the battery 11 is coupled to the ground potential 12. However, alternatively, the negative terminal of the battery 11 may be coupled to a floating potential In use, the switch circuit 10 operates as follows. Initially, with the momentary switch S1 in the position shown in FIG. 1, the switch circuit 10 is in the off state and the transistors Q1, Q2 and Q3 are turned off. Hence, there is no closed circuit path and the switch circuit 10 acts to prevent a power being supplied from the battery 11 to the load R5.

When the switch circuit 10 is in the off state, the only power consumption is a reverse leakage power consumption through the transistors Q1, Q2, Q3 which is virtually negligible compared with the self discharging current of the battery 11.

Accordingly, the initial potential at the points 1, 2, 3, 4, 5, 6, 7, 8 in the circuit 10 and the status of the transistors are as follows:

The potential at point 3=E (the potential of the battery 11);

The potential at point 1=0, as the transistor Q1 is switched off;

The potential across the base-emitter junction of the first transistor Q1=0;

The potential at point 2=the potential at point 3=E;

The current through R1=0;

The potential at point 7=the potential at point 2=E;

The voltage across the base-emitter junction of the second transistor Q3=0, as the second transistor Q3 is switched off;

The potential at point 4=the potential at point 7=E; Current through R3=0;

The potential at point 5=0;

The voltage across the base emitter junction of the third transistor Q2=0;

The current through the resistor R2=0;

The potential at point 6=0;

The potential across the capacitor C2=0;

The potential across the capacity C1=0; and

The potential at point 8=the potential at point 1=0.

Figure 2:
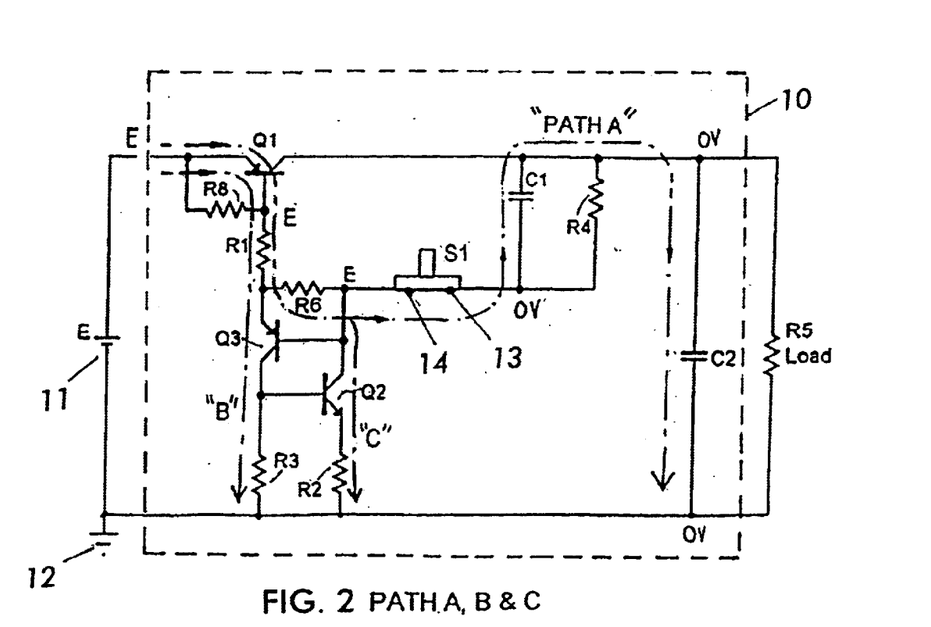
FIG. 2 is a circuit diagram of the switch circuit of FIG. 1 with the momentary switch in a closed position during switching on of the switch circuit.

When the momentary switch S1 is pressed to complete the contacts 13, 14 as shown in FIG. 2 an initial closed circuit (path A) is formed. This causes the base-emitter junctions of the first and second transistors Q1, Q3 to be forward biased thereby turning on transistors Q1, Q3. This generates an initial current, contributing to the base current for the first and second transistors Q1, Q3, which surges across the resistor R1 through path A and rapidly drops to zero due to the presence of the capacitor C1. This surge in base current drives the first and second transistors Q1, Q3 into saturation mode.

Simultaneously, the initial surge current passes through to resistor R3 (path B). As the voltage across R3 is raised rapidly due to the surge current, the base-emitter junction of the third transistor Q2 is forward biased thereby turning on the third transistor Q2. Similarly, the third transistor Q2 is also driven into saturation mode.

The third transistor Q2 takes its base current from the second transistor Q3 and at the same time, the third transistor supplies the base current to the second transistor Q3.

Therefore, the voltage across the base-emitter junction of the second transistor Q3 is maintained forward biased with the third transistor Q2 in saturated mode as illustrated by path C while the voltage across the base-emitter junction of the third transistor Q2 is kept forward biased by the second transistor Q3 operating in saturated mode as shown by path B.

In this way, without external current supply, the combination of the second and third transistors, Q3, Q2 will keep each other conducting as long as the battery 11 is coupled to the emitter of the second transistor Q3, that is the battery 11 is coupled to point 7 in the switch circuit 10. Therefore, the second and third transistors Q3, Q2 form a thyristor device which is triggered by the surge current generated in the switch circuit 10 when the momentary switch S1 is actuated. Therefore, even when path A is open circuit due to the capacitor C1 being fully charged, the closed circuit path B and path C maintain the forward biasing of the base-emitter junctions of the second and third transistors Q3, Q2. In a similar manner, the base-emitter junction of the first transistor Q1 is also maintained in a forward biased mode with its base current driven into saturation mode.

Therefore, in this state the switch circuit 10 is turned on and power is supplied through the transistor Q1 to the load R5.

It should be noted that when momentary switch S1 is actuated to complete the contacts 13, 14 the capacitor C1 is charged up through path A. When capacitor C1 is fully charged, this prevents further current passing through the capacitor C1 and therefore, path A changes to open circuit. Therefore, it does not matter for how long the momentary switch S1 is actuated, as C1 will cause path A to go open circuit when it is fully charged. When the momentary switch S1 is released, the capacitor C1 will start to discharge through the resistor R4 to a zero charge state.

When the momentary switch S1 is actuated again to complete the contacts 13, 14 (see FIG. 3) a closed circuit path D is formed in the switch circuit 10 as the capacitor C2 discharges. Therefore, the point 4 is momentary short circuited to point 8 during actuation of the switch S1.

Figure 3:
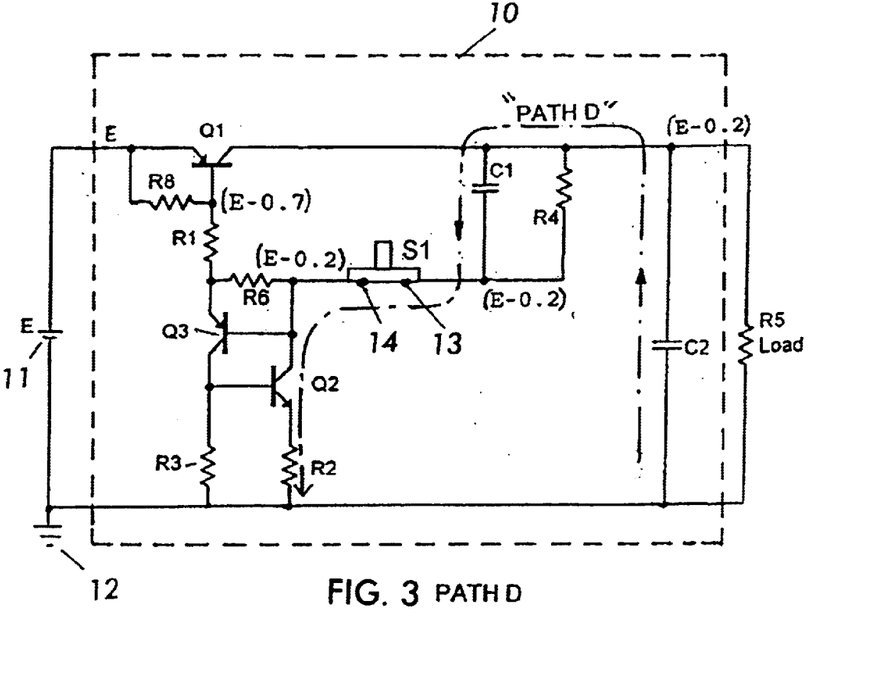
FIG. 3 is a circuit diagram of the switch circuit of FIG. 1 with the momentary switch in a closed position during switching off of the switch circuit.

However, when the capacitor C1 is fully charged, the capacitor C1 effectively make path D open circuit.

When the momentary switch S1 is pressed therefore, point 4 becomes the same potential as point 8 which is E-0.2 volts.

However, the voltage at point 2 during the on state of the circuit 10 is E-0.7 volts. Therefore, when point 4 goes to E-0.2 volts, the base-emitter junctions of the first transistor Q1 and the second transistor Q3 are no longer forward biased and the first and second transistors Q1, Q3 are switched off. With the second transistor Q3 in its off mode, the base of the second transistor Q3 is also switched off which switches off the third transistor Q2. Therefore, the switch circuit 10 is switched off and as the first transistor Q1 is switched off, no power is supplied from the battery 11 to the load R5 and; the remaining charge in the capacitor C2 discharges through the load R5.

After the capacitors C1 and C2 discharge completely, the switch circuit 10 reverse to the initial off state in which no power is supplied to the load R5 from the battery 11 and the only power consumed by the circuit 10 is the reverse leakage current through the first, second and third transistors Q1, Q3, Q2 which is virtually negligible.

Figure 4:
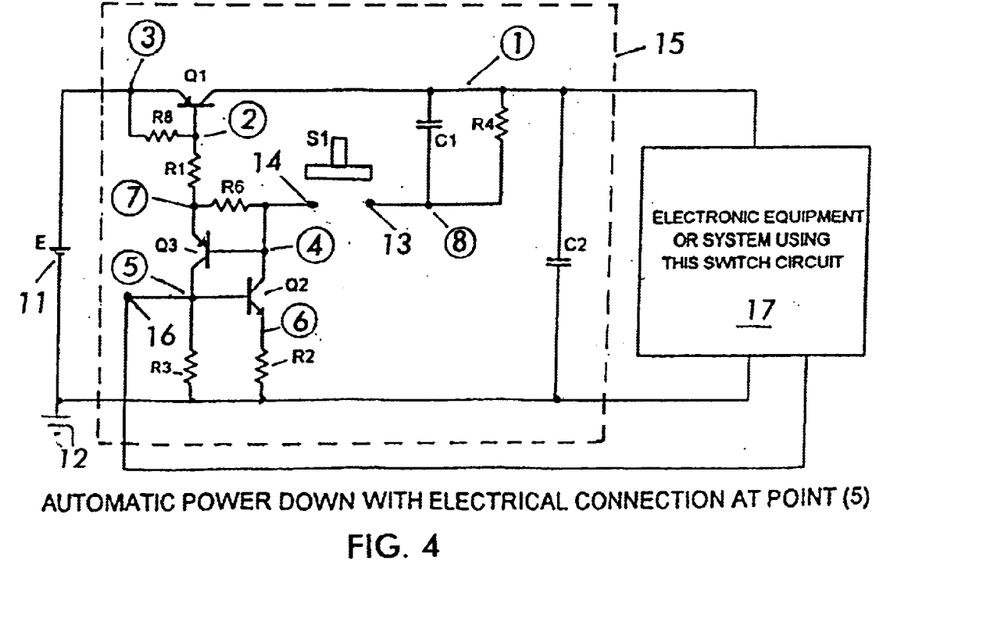
FIG. 4 is a circuit diagram of a second example of a switch circuit.

A second example of a switch circuit 15 is shown in FIG. 4. The switch circuit 15 is identical to the switch circuit 10, except that the circuit includes a signal input contact 16 at point 5 of the circuit. The signal input contact 16 is connected to electronic equipment 17, which is the equivalent of the load R5 shown in FIGS. 1 to 3. The signal input contact 16 permits the electronic equipment 17 to turn itself off automatically, for example, after a predetermined period of time. The electronic equipment 17 turns the switch circuit 15 to the off state by applying a ground potential to the signal input contact 16 which switches off the third transistor Q2 which in turn switches off the second transistor Q3. This causes the switch circuit 15 to become open circuit which switches off the first transistor Q1 to cut off power supply from the battery 11 to the load 17.

Figure 5:
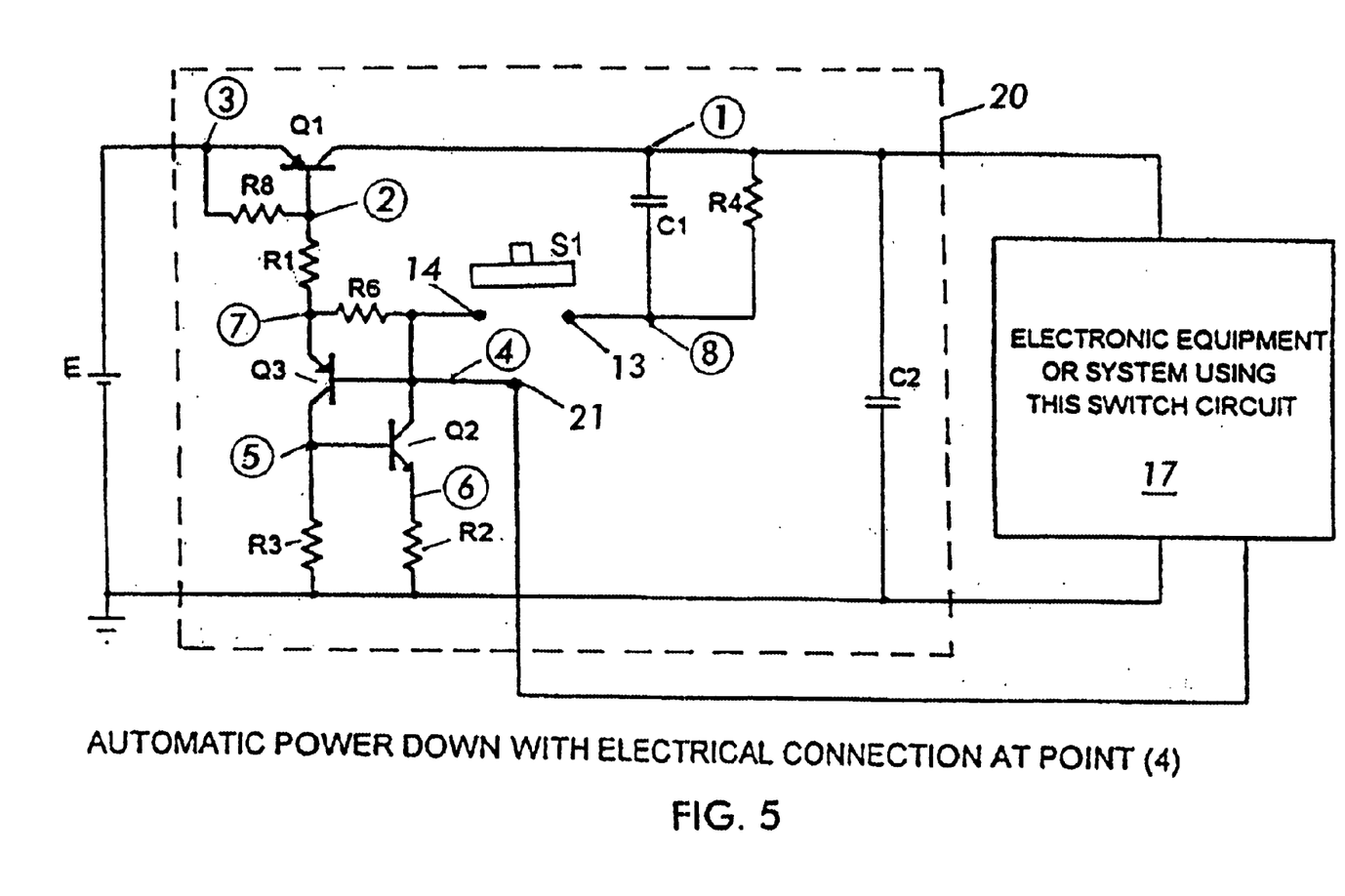
FIG. 5 is a circuit diagram of a third example of a switch circuit.

FIG. 5 shows a third example of a switch circuit 20 which is similar to the switch circuit 15 except a signal input contact 21 is connected at point 4. The signal input contact 21 when coupled to the electronic equipment 17 permits the electronic equipment 17 to switch off the switch circuit 20 by applying a high voltage state signal to contact 21. This causes the base emitter junction of the first and second transistors Q1, Q3 to be reversed biased which switches the first and second transistors Q1, Q3 off. With the first and second transistors Q1, Q3 switched off, the third transistor Q2 is also switched off as the potential at point 5 drops to zero and the switch circuit 20 is switched into the off state.

In FIGS. 4 and 5 it is important that the electrical connection from the electronic equipment 17 to the signal input contact 16, 21 is maintained at a high impedance at all times except when a switch off signal is delivered to the signal input contact 16, 21.

Figure 6:
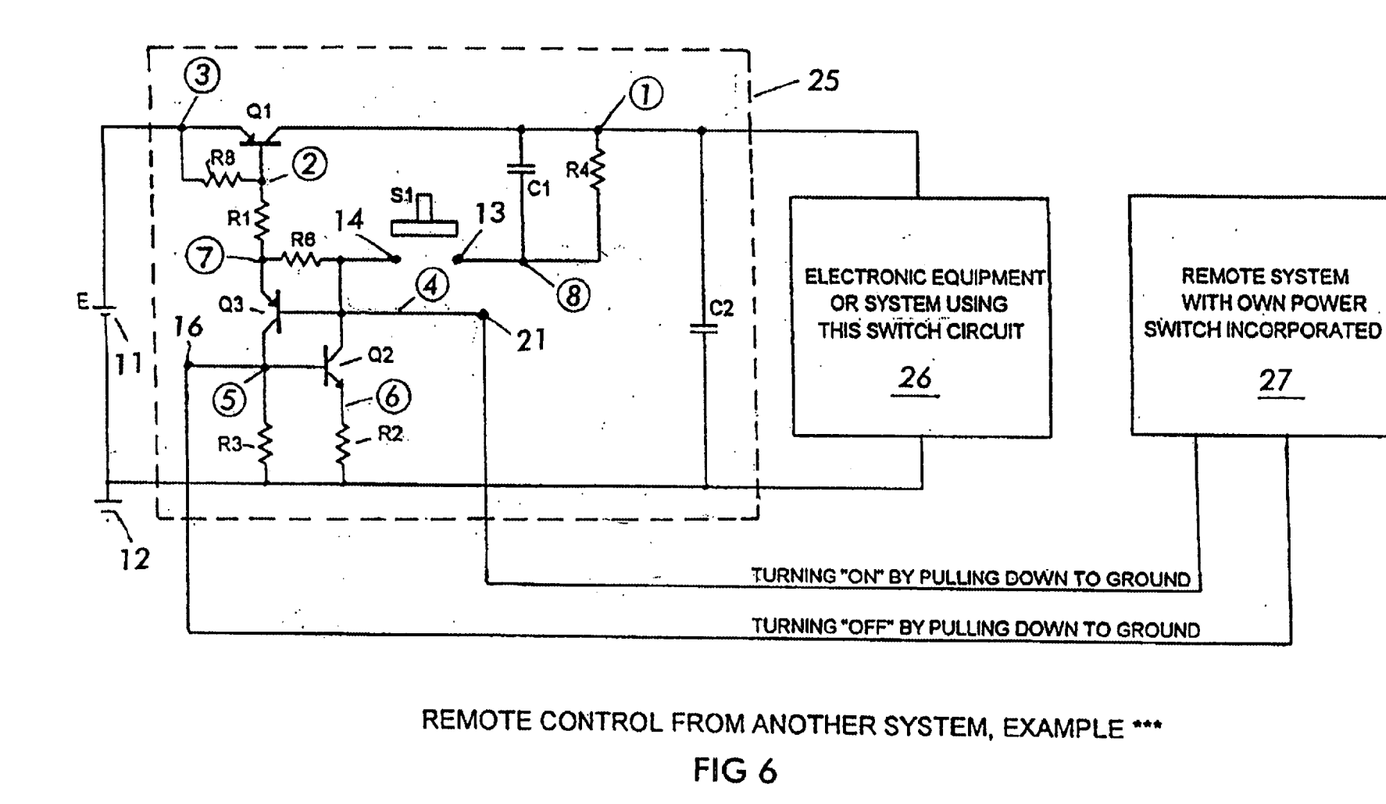
FIG. 6 is a circuit diagram of a fourth example of a switch circuit.

FIG. 6 shows a fourth example of a switch circuit 25. The switch circuit 25 is provided with a first switch signal input contact 16 connected to point 5 and a second switch signal input contact 21 connected to point 4. The switch circuit 25 controls the supply of power from the battery 11 to electronic equipment 26. The switch input contacts 16, 21 are coupled to a remote electronic system 27 which has its own power switch incorporated therein. The power switch incorporated within the remote electronic system 27 may be a switch circuit similar to any of the switch circuits 10, 15, 20, or may also be a switch circuit 25, controlled remotely by a further remote electronic system.

The switch circuit 25 permits remote power control from the other remote electronic system 27 and may be used for example, with a multi-unit system. The remote system 27 can switch the switch circuit 25 to the on state by applying a ground potential (or a sufficiently low level voltage) to the signal input contact 21 to forward bias transistor Q3.

Alternatively, the remote system 27 can switch the switch circuit 25 to the off state by applying a ground potential signal to signal input contact 16.

In all the switch circuits 15, 20, 25 a momentary switch S1 is still provided which permits a user to manually switch circuits 15, 20, 25 between the off and on states.

As an alternative to the remote system being connected to separate input contacts 16, 21 it is possible that the remote system 27 could be connected by a single line to either the switch circuit 15 or the switch circuit 20. In the case of the switch circuit 15, the remote system 27 would switch on the circuit 15 by supplying a sufficiently high voltage level to the signal input contact 16 and switch off the circuit 15 by applying a ground potential to the signal input contact 16.

Where the remote system 27 is connected to signal input contact 21 in circuit 20, the remote system 27 would switch on the circuit 20 by applying a ground potential to the signal input contact 21 and switch off the circuit 20 by applying a sufficiently high voltage level to the signal input contact 21 to reverse bias the first and second transistors Q1, Q3.

Although the switches 10, 15, 20, 25 are shown controlling the supply of power from a battery 11 to load R5 or electronic equipment 17, 26, the circuits could also be used to control the supply of power from a rectified AC supply and from an AC main supply to electronic equipment having a heavy power consumption.

Figure 7:
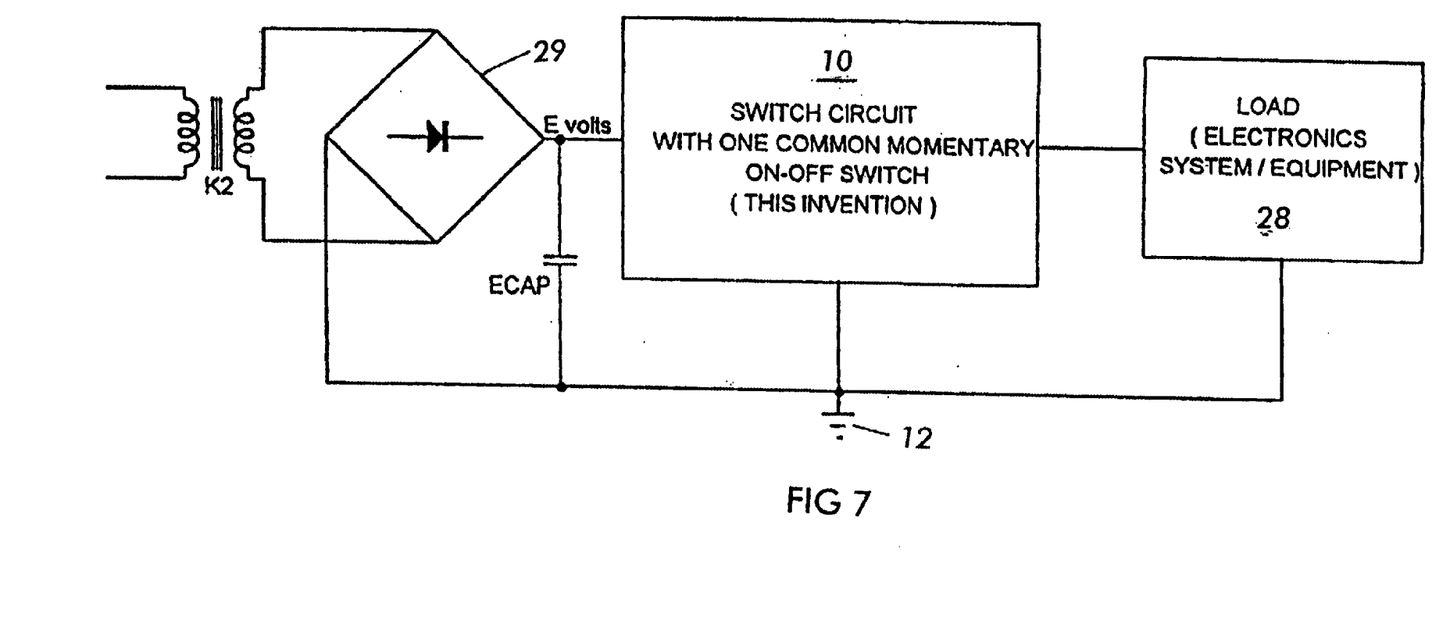
FIG. 7 is a schematic diagram showing the switch circuit of FIGS. 1 to 3 being used to control electrical power from a rectified AC mains supply.

FIG. 7 shows an example of the switch circuit 10 being used to control a rectified AC power supply from a transformer K2 and a full wave rectifier 29 to a load 28. However, switch circuit 10 could be replaced by any of switch circuits 15, 20, 25.

Figure 8:
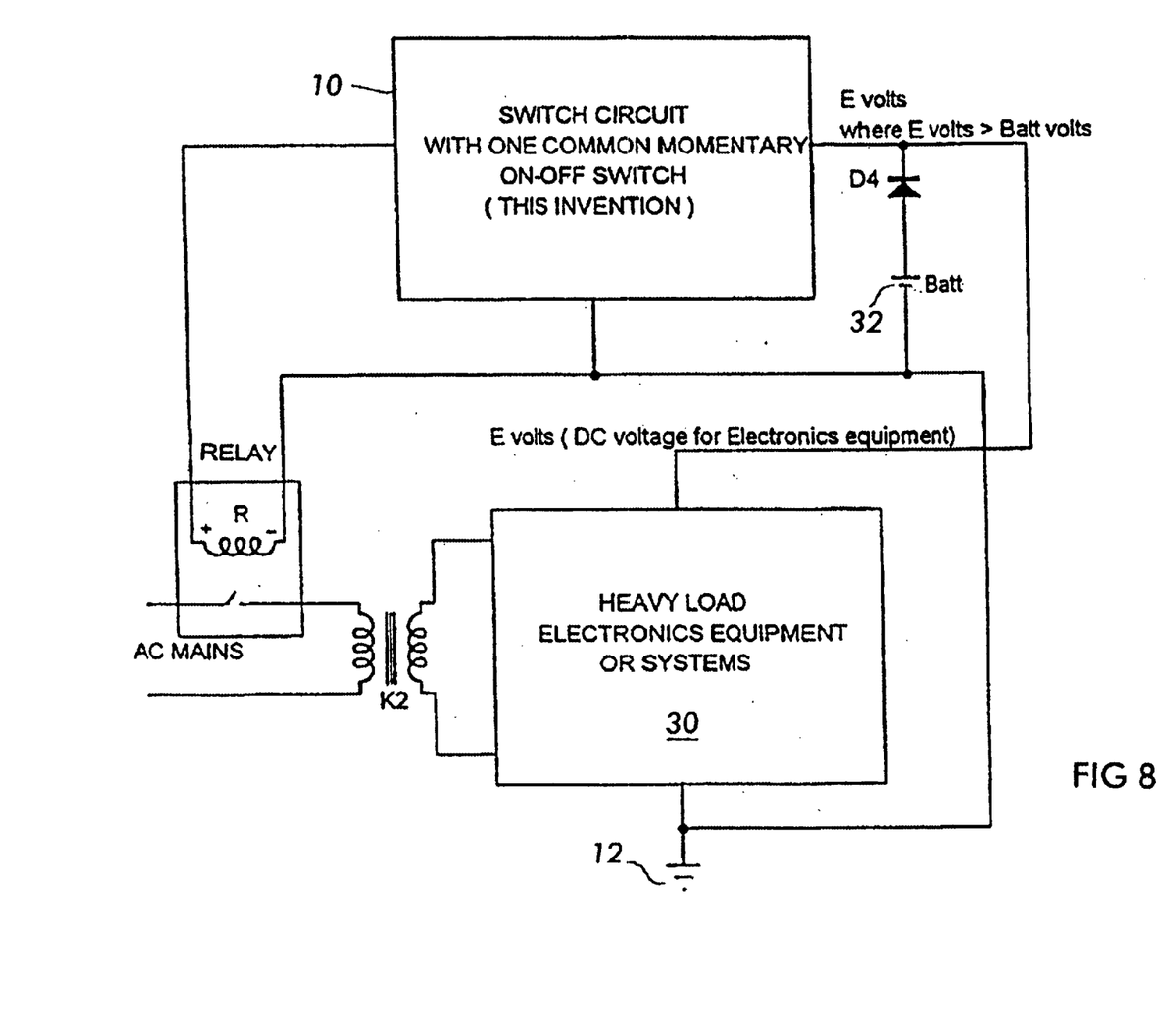
FIG. 8 is a schematic diagram showing the switch circuit of FIGS. 1 to 3 being used to control an AC power supply for a high power consumption load; and, FIG. 9 is a circuit diagram of a fifth example of a switch circuit.

FIG. 8 shows the switch circuit 10 being used to control power supply from an AC mains supply to a heavy load 30 through a transformer K2, a relay R, a diode D4 and a battery 32.

Figure 9:
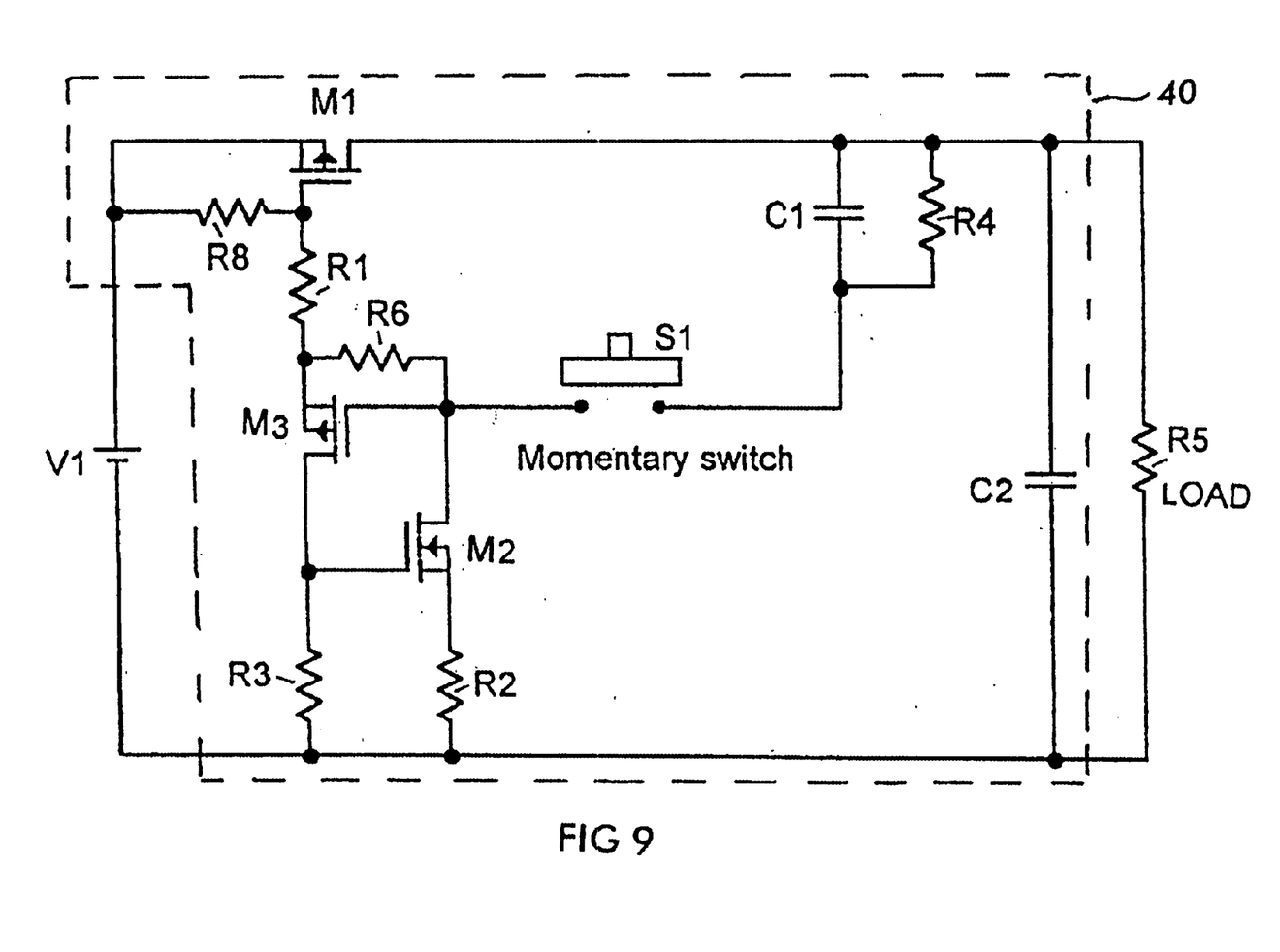

FIG. 9 is a circuit diagram showing a fifth example of a switch circuit 40. The switch circuit 40 is identical to the switch circuit 10 except that the bipolar transistors Q1, Q2, Q3 are replaced by enhancement type MOSFETs M1, M2, M3 respectively. The transistors M1, M3 are P channel enhancement type MOSFETs and the transistor M2 is a N channel enhancement type MOSFET. The principle of operation of the switch circuit 40 is identical to the switch circuit 10.

What is claimed is:

1. A switch circuit for controlling the supply of electrical power from an electrical power source to a load, the switch circuit comprising a first transistor, the emitter of the first transistor adapted to be coupled to the power supply and the collector adapted to be coupled to the load; an electronic switching device comprising an input, an output adapted to be coupled to the other side of the load and the power source, and an activating input; a first resistance device coupled between the base of the first transistor and the input of the electronic switching device; a momentary switch having first and second terminals, the activating input of the electronic switching device coupled to the first terminal of the momentary switch; a pulse generation device coupled between the collector of the first transistor and the second terminal of the momentary switch; and a charge storing device coupled between the collector of the first transistor and the output of the electronic switching device.

2. A switch circuit according to claim 1, wherein the electronic switching device comprises a thyristor device.

3. A switch circuit according to claim 2, wherein the thyristor device comprises second and third transistors.

4. A switch circuit according to claim 3, wherein the base of the second transistor is coupled to the collector of the third transistor, and the base of the third transistor is coupled to the collector of the second transistor.

5. A switch circuit according to claim 4, wherein the input of the electronic switching device is coupled to the emitter of the third transistor, the output is coupled to the emitter of the second transistor, and the activating input is coupled to the base of the third transistor and the collector of the s cond transistor.

6. A switch circuit according to claim 1, wherein the first transistor is a bipolar transistor.

7. A switch circuit according to claim 1, wherein the first transistor is a MOSFET.

8. A switch circuit according to claim 7, wherein the MOSFET is an enhancement type MOSFET.

9. A switch circuit according to claim 6, wherein the second and third transistors are bipolar transistors.

10. A switch circuit according to claim 7, wherein the second and third transistors are MOSFET.

11. A switch circuit according to claim 1, wherein the pulse generation device comprises a capacitance device.

12. A switch circuit according to claim 11, wherein the pulse generation device further comprises a third resistance device in parallel with the capacitance device.

13. A switch circuit according to claim 1, further comprising a first signal input contact coupled to the activating input of the electronic switching device.

14. A switch circuit according to claim 3, further comprising a second signal input contact to the collector of the collector of the third transistor and the base of the second transistor.

* * * * *